United States Patent
Nakamura

(10) Patent No.: US 8,730,747 B2
(45) Date of Patent: May 20, 2014

(54) SEMICONDUCTOR DEVICE INCLUDING SEMICONDUCTOR MEMORY CIRCUIT

(71) Applicant: Seiko Instruments Inc., Chiba (JP)

(72) Inventor: Takashi Nakamura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 13/750,481

(22) Filed: Jan. 25, 2013

(65) Prior Publication Data

US 2013/0194878 A1   Aug. 1, 2013

(30) Foreign Application Priority Data

Jan. 30, 2012  (JP) ................................. 2012-017197
Nov. 7, 2012   (JP) ................................. 2012-245672

(51) Int. Cl.
*G11C 7/00* (2006.01)
*G11C 29/00* (2006.01)

(52) U.S. Cl.
USPC .. 365/201; 365/189.07; 714/30; 714/E11.153

(58) Field of Classification Search
USPC ................ 365/201, 189.07; 714/30, E11.137
See application file for complete search history.

(56) References Cited

U.S. PATENT DOCUMENTS

| 6,271,692 B1 | 8/2001 | Iihoshi et al. |
| 7,415,730 B2 * | 8/2008 | Watanabe ........................ 726/26 |
| 7,443,760 B2 * | 10/2008 | Do ............................ 365/230.05 |

FOREIGN PATENT DOCUMENTS

JP   2000-269428 A   9/2000

* cited by examiner

*Primary Examiner* — Harry W Byrne
*Assistant Examiner* — Lance Reidlinger
(74) *Attorney, Agent, or Firm* — Brinks Gilson & Lione

(57) ABSTRACT

The semiconductor device including a memory circuit is configured to include a mode switching circuit additionally provided with a data comparison circuit which detects that a serial signal supplied to an input terminal for communication and a serial signal supplied to an input terminal used for a purpose other than communication are reversed from each other, a decoder circuit which detects that a serial signal carries predetermined data and which outputs a detection signal, a control signal generating circuit which generates a control signal, and a circuit which outputs a signal for switching to a test mode on the basis of the signals.

4 Claims, 3 Drawing Sheets

SEMICONDUCTOR DEVICE INCLUDING SEMICONDUCTOR MEMORY CIRCUIT

RELATED APPLICATIONS

This application claims priority under 35 U.S.C. §119 to Japanese Patent Application Nos. 2012-017197 filed on Jan. 30, 2012 and 2012-245672 filed on Nov. 7, 2012, the entire contents of which are hereby incorporated by reference.

BACKGROUND OF THE INVENTION

1. Field of the Invention

The present invention relates to a semiconductor device including a semiconductor memory circuit and, more particularly, to a mode switching circuit which permits easy switching between a normal operation mode and a test mode without an erroneous operation.

2. Description of the Related Art

The following describes a mode switching circuit of a semiconductor device equipped with a conventional semiconductor memory circuit. FIG. 3 is a circuit diagram illustrating a conventional mode switching circuit.

The conventional mode switching circuit includes an input terminal 501, an internal circuit 502, P-type MOS transistors 503 and 504, an N-type MOS transistor 505, and a voltage determination circuit 507.

The internal circuit 502 is connected with the input terminal 501 through a resistor 506. The internal circuit 502 is provided with an inverter for input signals, and a power supply voltage Vcc (e.g., 5V) is supplied thereto. The voltage determination circuit 507 is connected to a node N1. The P-type MOS transistors 503 and 504 are diode-connected between the input terminal 501 and a supply terminal such that they face in the opposite directions. The N-type MOS transistor 505 is diode-connected between the input terminal 501 and an earth terminal. The voltage determination circuit 507 has a voltage detection inverter for detecting the voltage of the input terminal 501 and a conversion inverter which carries out the level conversion of a detection signal to a power supply voltage Vcc. In the voltage detection inverter, the voltage of the node N1 is input to the power source thereof, while the power supply voltage Vcc is supplied to the input terminal thereof. In the conversion inverter, the power supply voltage Vcc is input to the power source thereof, while an output signal of the voltage detection inverter is supplied to the input terminal thereof. The voltage determination circuit 507 outputs a detection signal to the internal circuit 502.

The conventional mode switching circuit operates as described below to switch from a normal operation mode to a test mode (refer to, for example, patent document 1).

When a signal of a voltage (e.g., 0V to 5V) for the normal operation is supplied to the input terminal 501, a P-type MOS transistor 508 of the voltage determination circuit 507 turns off, because the source voltage changes in the range from 0V to 5V, and an N-type MOS transistor 509 turns on. This causes the voltage determination circuit 507 to output a Hi signal to the internal circuit 502, so that the internal circuit 502 maintains the normal operation mode.

Next, if a voltage (e.g., 10V) that is higher than the voltage for the normal operation is supplied to the input terminal 501, then the P-type MOS transistor 508 of the voltage determination circuit 507 turns on, because the source voltage rises to 10V, and the N-type MOS transistor 509 turns off. Hence, the voltage determination circuit 507 outputs a Lo signal to the internal circuit 502, causing the internal circuit 502 to switch to the test mode.

[Patent Document 1] Japanese Patent Application Laid-Open No. 2000-269428

However, according to the prior art, a high voltage is applied to the input terminal used for the normal operation mode, so that it is necessary to provide a protection transistor to protect the input terminal and the internal circuit from the high voltage. It is also necessary to provide a voltage determination circuit to determine that the high voltage has been applied to the input terminal. This has been posing a problem of an increased area of the mode switching circuit.

In addition, the high voltage for engaging the test mode has to be set at a sufficiently higher level than that of the input voltage for the normal operation mode so as to prevent the test mode from being accidentally engaged. There has been, however, a problem in that securing an adequate margin to accommodate variations in the voltage determination circuit is difficult due to deteriorated withstand voltage of a protection transistor with the increasing trend toward miniaturization of the elements in a semiconductor integrated circuit and faster element operations.

SUMMARY OF THE INVENTION

The present invention has been made with a view toward the problems described above, and an object of the invention is to provide a semiconductor device equipped with a semiconductor memory circuit and, more particularly, to a mode switching circuit which has a small chip area and which permits easy switching to a test mode without an erroneous operation.

To solve the problems described above, a semiconductor device having a semiconductor memory circuit in accordance with the present invention is configured to include a mode switching circuit additionally provided with a data comparison circuit which detects that a serial signal supplied to an input terminal for communication and a serial signal supplied to an input terminal used for a purpose other than communication are reversed from each other, a decoder circuit which detects that a serial signal carries predetermined data and which outputs a detection signal, a control signal generating circuit which generates a control signal, and a circuit which outputs a signal for switching to a test mode on the basis of the signals.

According to the present invention, a mode switching circuit capable of switching to a test mode without an erroneous operation can be configured without increasing a chip area.

DETAILED DESCRIPTION OF THE PREFERRED EMBODIMENTS

A mode switching circuit of a semiconductor device provided with a semiconductor memory circuit in accordance with the present invention has been achieved by making changes and addition to a communication circuit of the semiconductor memory circuit provided in the semiconductor device, thereby permitting mode switching to be accomplished without supplying a high voltage.

More specifically, a data comparison circuit which detects that a serial signal supplied to an input terminal for communication and a serial signal supplied to an input terminal used for a purpose other than communication are reversed from each other, a decoder circuit which detects that a serial signal carries predetermined data and which outputs a detection signal, a control signal generating circuit which generates a control signal on the basis of the serial signal, and a circuit which outputs a switching signal for switching to a test mode on the basis of the signals have been added.

The following describes an embodiment of the present invention with reference to the accompanying drawings.

Figure 1:
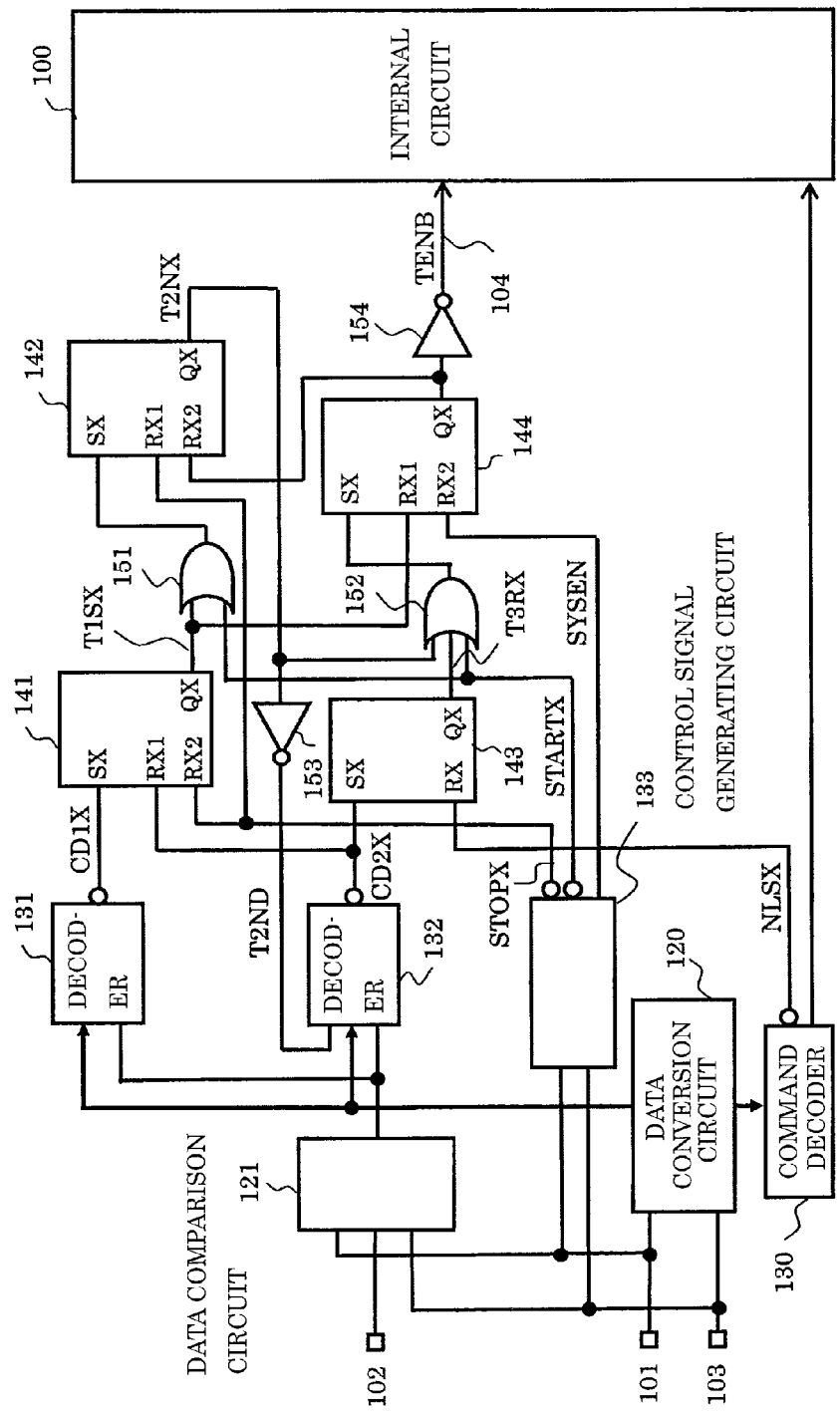
FIG. 1 is a circuit diagram illustrating a mode switching circuit according to a present embodiment of a semiconductor device having a semiconductor memory circuit.

FIG. 1 is a circuit diagram of the mode switching circuit according to a present embodiment of the semiconductor device provided with the semiconductor memory circuit. The present embodiment is the mode switching circuit of the semiconductor memory circuit provided with a 2-wire serial data communication system (e.g., I²C bus).

The mode switching circuit of the present embodiment is constituted of input terminals 101 and 102, a clock terminal 103, an output terminal 104, a data conversion circuit 120, a data comparison circuit 121, a command decoder circuit 130, a first decoder circuit 131, a second decoder circuit 132, a control signal generating circuit 133, SR latch circuits 141, 142, 143, and 144, OR circuits 151 and 152, and inverters 153 and 154.

The input terminals 101 and 102 and the clock terminal 103 are connected to the data conversion circuit 120. The input terminals 101 and 102 and the clock terminal 103 are connected to the data comparison circuit 121. The input terminal 101 and the clock terminal 103 are connected to the control signal generating circuit 133. The output terminal of the data conversion circuit 120 is connected to the command decoder circuit 130, the first decoder circuit 131, and the second decoder circuit 132. The output terminal of the data comparison circuit 121 is connected to the first decoder circuit 131 and the second decoder circuit 132. A first output terminal of the command decoder circuit 130 is connected to an internal circuit 100, and a second output terminal thereof (a node NLSX) is connected to an input terminal RX of the SR latch circuit 143. An output terminal (a node D1X) of the first decoder circuit 131 is connected to an input terminal SX of the SR latch circuit 141. The output terminal (a node D2X) of the second decoder circuit 132 is connected to an input terminal RX1 of the SR latch circuit 141 and an input terminal SX of the SR latch circuit 143. A first output terminal (a node STOPX) of the control signal generating circuit 133 is connected to an input terminal RX2 of the SR latch circuit 141 and an input terminal RX1 of the SR latch circuit 142, a second output terminal thereof (a node STARTX) is connected to the input terminals of the OR circuits 151 and 152, and a third output terminal thereof (a node SYSEN) is connected to an input terminal RX2 of the SR latch circuit 144. An output terminal QX (a node T1SX) of the SR latch circuit 141 is connected to an input terminal of the OR circuit 151 and the input terminal RX1 of the SR latch circuit 144. The output terminal QX of the SR latch circuit 143 is connected to the input terminal of the OR circuit 152. An output terminal of the OR circuit 151 is connected to the input terminal SX of the SR latch circuit 142. An output terminal of the OR circuit 152 is connected to the input terminal SX of the SR latch circuit 144. An output terminal QX (a node T2NX) of the SR latch circuit 142 is connected to the second decoder circuit 132 through the input terminal of the OR circuit 152 and the inverter 153. The output terminal QX of the SR latch circuit 144 is connected to the internal circuit 100 through an input terminal RX2 of the SR latch circuit 142 and an output terminal 104 (a node TENB) of the inverter 154.

The input terminal 101 is an input terminal that receives a serial signal during the communication in the normal operation. The input terminal 102 is an input terminal used for a purpose other than the communication, e.g., for receiving a signal for selecting a function. The clock terminal 103 is an input terminal for receiving a clock signal during the communication in the normal operation.

The data conversion circuit 120 converts a serial signal received from the input terminal 101 into a parallel signal. The data comparison circuit 121 outputs a result of the comparison between a signal at the input terminal 101 and a signal at the input terminal 102. According to the present embodiment, if the signal at the input terminal 101 and the signal at the input terminal 102 are reversed from each other, then the data comparison circuit 121 outputs a detection signal. Upon receipt of the parallel signal, the command decoder circuit 130 outputs a command signal to the internal circuit 100. The first decoder circuit 131 detects a first data signal (e.g., 7-bit) from the parallel signal and outputs the detection signal of the first data signal if the detection signal from the data comparison circuit 121 has been received. The second decoder circuit 132 detects a second data signal (e.g., 7-bit) from the parallel signal and outputs the detection signal of the second data signal if the detection signal from the data comparison circuit 121 and a test mode flag 2 of the SR latch circuit 142 have been received. The control signal generating circuit 133 outputs a start signal and a stop signal according to the clock signal and the signal state at the input terminal 101, and outputs a system control signal for controlling the SR latch circuit 144, which outputs a test signal.

The operation of the mode switching circuit according to the present embodiment will now be described with reference to a timing chart.

Figure 2:
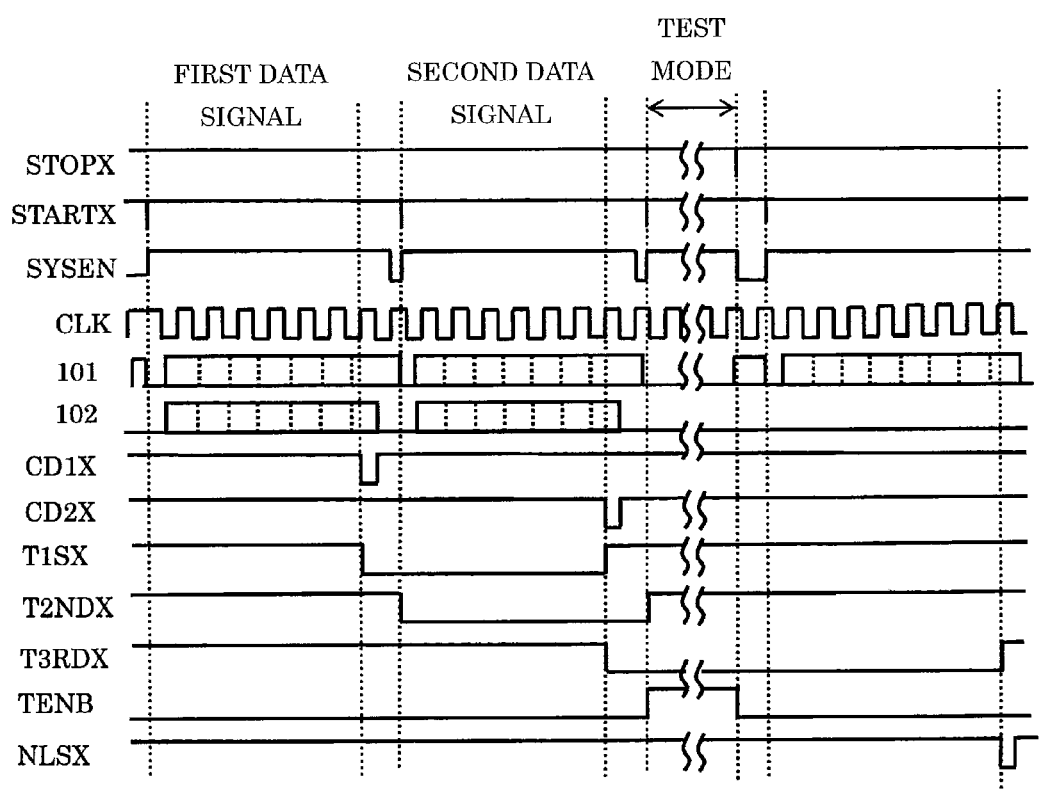
FIG. 2 is a timing chart illustrating an operation of the mode switching circuit according to the present embodiment.
Figure 3:
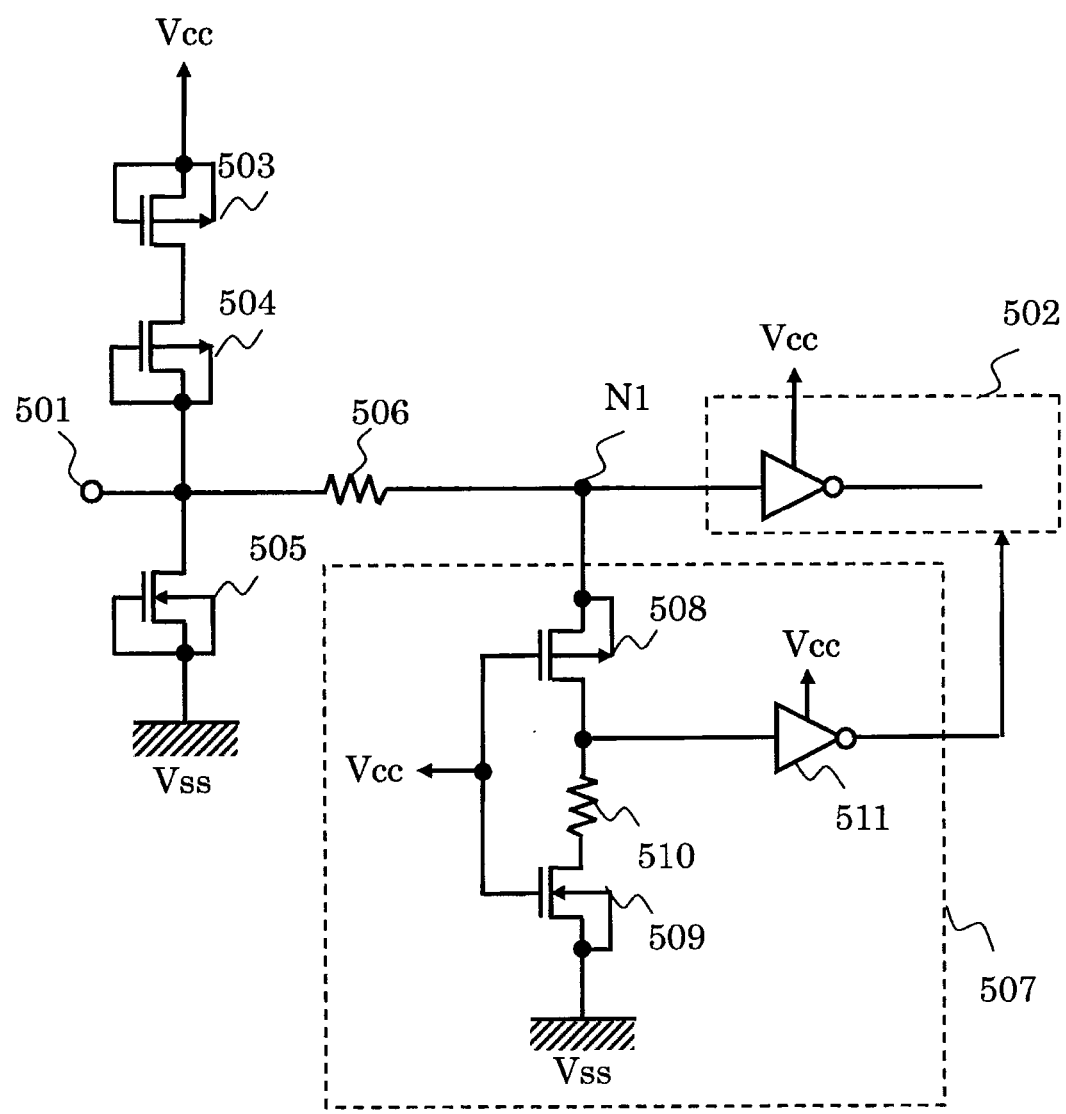
FIG. 3 is a circuit diagram illustrating a mode switching circuit of a semiconductor device having a conventional semiconductor memory circuit.

FIG. 2 is a timing chart illustrating the operation of the mode switching circuit according to the present embodiment.

First, the clock terminal 103 and the input terminal 101 are set to Hi, and then the input terminal 101 is switched from Hi to Lo. This causes the control signal generating circuit 133 to output a start signal to the second output terminal (the node STARTX) and the system control signal at the third output terminal (the node SYSEN) to be switched from Lo to Hi. In this state, first data signals having phases that are reversed from each other are supplied to the input terminal 101 and the input terminal 102, respectively, and a clock signal is supplied to the clock terminal 103. The data comparison circuit 121 sequentially compares the data signals at the input terminal 101 and the input terminal 102 bit by bit. If the data signals are detected to have phases that are reversed from each other, then the data comparison circuit 121 outputs a detection signal to the first decoder circuit 131 and the second decoder circuit 132. The data conversion circuit 120 converts the serial signal received from the input terminal 101 into a parallel signal and outputs the parallel signal to the command decoder circuit 130, the first decoder circuit 131, and the second decoder circuit 132. Upon receipt of the parallel signal, the command decoder circuit 130 outputs an initialization signal of the mode switching circuit to the SR latch circuit 143 and also outputs a command signal to the internal circuit 100.

If the parallel signal is a first data signal and the detection signal has been received from the data comparison circuit 121, then the first decoder circuit 131 outputs a Lo pulse to an input terminal SX of the SR latch circuit 141 from an output terminal (a node CD1X) at the timing of a seventh clock signal, i.e., when the parallel signal is detected as the first data signal. The SR latch circuit 141 switches an output terminal QX (a node T1SX) from Hi to Lo and sets a test mode flag 1.

The control signal generating circuit 133 switches the third output terminal (the node SYSEN) from Hi to Lo at the timing of an eighth clock signal and then switches the third output terminal from Lo to Hi when the clock terminal 103 is Hi and the input terminal 101 switches from Hi to Lo. At this time, the start signal is output at the same time, so that both input terminals of the OR circuit 151 are Lo and the input terminal SX of the SR latch circuit 142 is Lo. Thus, the SR latch circuit 142 switches the output terminal QX (the node T2NX) from Hi to Lo so as to set a test mode flag 2.

The description has been given with reference to the timing chart of FIG. 2 on the assumption that the data of the seventh bit of the first data signal changes from Hi to Lo at the timing of the eighth clock signal. Alternatively, however, one pulse may be inserted between the first data signal and the second data signal and the node SYSEN may be switched from Hi to Lo to output the start signal at the timing when the inserted pulse switches from Hi to Lo. The switch timing is not limited to the timing of the eighth clock signal.

Further, the second data signals, the phases of which are reversed from each other, are supplied to the input terminal 101 and the input terminal 102, and the clock signal is supplied to the clock terminal 103. The data comparison circuit 121 sequentially compares the data signals at the input terminal 101 and the input terminal 102 bit by bit. If the data signals are detected to have phases that are reversed from each other, then the data comparison circuit 121 outputs a detection signal to the first decoder circuit 131 and the second decoder circuit 132.

If the parallel signal is a second data signal and if the detection signal from the data comparison circuit 121 and the test mode flag 2 from the SR latch circuit 142 vehicle have been received, then the second decoder circuit 132 outputs a Lo pulse to the input terminal RX1 of the SR latch circuit 141 from an output terminal (a node CD2X) and the input terminal SX of the SR latch circuit 143 at the timing of a seventh clock signal, i.e., when the parallel signal is detected as the second data signal. The SR latch circuit 141 switches the output terminal QX (the node T1SX) from Lo to Hi so as to reset the test mode flag 1. The SR latch circuit 143 switches an output terminal QX (a node T3RX) from Hi to Lo so as to set a test mode flag 3.

Similarly, the control signal generating circuit 133 switches the third output terminal (the node SYSEN) from Hi to Lo at the timing of the eighth clock signal and then switches the third output terminal from Lo to Hi when the clock terminal 103 is Hi and the input terminal 101 switches from Hi to Lo. At this time, the start signal is output at the same time, so that all the three input terminals of the OR circuit 152 will be Lo and the input terminal SX of the SR latch circuit 144 will be Lo. Thus, the SR latch circuit 144 switches the output terminal QX from Hi to Lo and switches an output terminal (a node TENB) of the inverter 154 to Hi (a switching signal) so as to set the internal circuit 100 to the test mode. At this time, the input terminal SX of the SR latch circuit 142 becomes Lo, causing the output terminal QX (the node T2NX) to switch from Lo to Hi and the test mode flag 2 to be reset.

The method for clearing the test mode will now be described. Switching the input terminal 101 from Lo to Hi while the clock terminal 103 is Hi causes the control signal generating circuit 133 to output the stop signal to the first output terminal (the node STOPX). The SR latch circuits 141 and 142 are reset by the stop signal. At the same time, the control signal generating circuit 133 switches the third output terminal (the node SYSEN) to Lo so as to set the output terminal QX of the SR latch circuit 144 to Lo and set the output terminal (the node TENB) of the inverter 154 to Hi so as to clear the test mode of the internal circuit 100. At this time, the test mode flag 3 of the present embodiment is in a set state, but will be reset by one pulse at an output node NRMRSTX of the command decoder circuit 130 at the timing of the eighth clock from the clock terminal 103 after the normal operation command is transmitted. However, the method for resetting the test mode flag 3 the test mode is not limited to the one described above as long as the test mode flag 3 is reset after clearing the test mode.

As described above, the mode switching circuit according to the present embodiment is adapted to detect that the first data signal and the second data signal, which have phases that are reversed from each other, have been supplied to the input terminal 101 and the input terminal 103 for communication and then output the signal for switching to the test mode, thus making it possible to prevent the test mode from being accidentally engaged. Moreover, the test mode can be easily cleared simply by switching the input terminal 101 from Lo to Hi while the clock signal is Hi.

The mode switching circuit according to the present embodiment has been described by referring to the mode switching circuit diagram illustrating the semiconductor memory circuit provided with the 2-wire serial data communication system. The present invention, however, can be applied in the same manner also to a semiconductor memory circuit provided with a 3-wire serial data communication system.

For example, the control signal generating circuit 133 may be configured to output the start signal and the stop signal according to a signal at a chip select terminal, thereby controlling the SR latch circuit 144, which outputs the test signal.

What is claimed is:

1. A semiconductor device including a semiconductor memory circuit, which has a clock input terminal to which a clock signal is supplied and a first input terminal for communication to which a data signal is supplied, and a mode switching circuit comprising:
    a data comparison circuit which detects that data signals having phases that are reversed from each other have been supplied to the first input terminal and a second input terminal;
    a first decoder circuit which detects that a first data signal of the data signals has been received and outputs a detection signal in combination with a detection signal of the data comparison circuit;
    a second decoder circuit which detects that a second data signal of the data signals has been received and outputs a detection signal in combination with the detection signal of the data comparison circuit and the detection signal of the first decoder circuit; and
    a circuit which outputs a switching signal for shifting to a test mode upon receipt of the detection signals from the first decoder circuit and the second decoder circuit.

2. The semiconductor device including a semiconductor memory circuit according to claim 1, further comprising:
    a control signal generating circuit which outputs a control signal,
    wherein the detection signals of the first decoder circuit and the second decoder circuit and the switching signal are output upon receipt of the control signal.

3. The semiconductor device including a semiconductor memory circuit according to claim 2, wherein the control signal generating circuit outputs the control signal according to the clock signal and a data signal at the first input terminal.

4. The semiconductor device including a semiconductor memory circuit according to claim 2, wherein the control signal generating circuit outputs the control signal according to a signal at a chip select terminal.

* * * * *